(12) United States Patent
Chen et al.

(10) Patent No.: US 7,324,575 B2
(45) Date of Patent: Jan. 29, 2008

(54) LENS WITH REFLECTIVE SURFACE

(75) Inventors: Bo Su Chen, Plano, TX (US); James R. Biard, Richardson, TX (US)

(73) Assignee: Finisar Corporation, Sunnyvale, CA (US)

(*) Notice: Subject to any disclaimer, the term of this patent is extended or adjusted under 35 U.S.C. 154(b) by 54 days.

(21) Appl. No.: 10/781,590

(22) Filed: Feb. 17, 2004

(65) Prior Publication Data

US 2005/0180471 A1    Aug. 18, 2005

(51) Int. Cl.
*H01S 3/08* (2006.01)
(52) U.S. Cl. .......................................... 372/101; 372/99
(58) Field of Classification Search ................ 372/101, 372/99; 359/642, 729
See application file for complete search history.

(56) References Cited

U.S. PATENT DOCUMENTS

| | | | | |
|---|---|---|---|---|
| 3,825,322 A | * | 7/1974 | Mast | 359/799 |
| 5,084,711 A | * | 1/1992 | Moss et al. | 343/911 R |
| 5,343,487 A | * | 8/1994 | Scott et al. | 372/50.124 |
| 6,330,057 B1 | * | 12/2001 | Lederer et al. | 356/28 |
| 6,639,203 B1 | * | 10/2003 | Kerschner | 250/216 |

FOREIGN PATENT DOCUMENTS

JP            63089925       * 10/1998

* cited by examiner

*Primary Examiner*—Armando Rodriguez
(74) *Attorney, Agent, or Firm*—Workman Nydegger

(57) ABSTRACT

A lens having a reflective surface, and systems that use such a lens. The lens includes a transmissive part for passing a portion of an incident light beam, and a reflective part for reflecting a portion of the incident light beam, and the reflective part is preferably substantially non-transmissive. Such a lens may be particularly suitable in systems that include a back monitor photo detector that is used for sampling and controlling the output power of a light source.

37 Claims, 16 Drawing Sheets

Annular mirror

Rectangular mirror

Annular mirror

Rectangular mirror

Annular mirror

Rectangular mirror

LENS WITH REFLECTIVE SURFACE

BACKGROUND

Lenses are commonly used in optical systems to direct and/or reconfigure light. In data communication systems, for example, lenses are used to direct and/or reconfigure light provided by a light source to a detector, optical fiber or some other destination. In many cases, the light source is provided in a light source package, and the lens is provided outside of the light source package.

To help stabilize the light beam provided by a light source, many light source packages include both a light source and a back monitor photo detector. The back monitor photo detector typically samples a portion of the light beam and provides a signal indicative of the amount of light detected by the signal path photo detector. A controller receives a signal from the back monitor photo detector, and adjusts the power of the light source to a desired, often constant, level. This can be beneficial as some electrical/optical parameters of some light sources, such as lasers, can vary due to effects such as manufacturing tolerance, temperature and aging. As such, control of the power output of light sources can enhance the performance of systems that use the light sources. It is advantageous to have a constant ratio between the response of the back monitor photo detector and the signal path photo detector.

In many cases, the back monitor photo detector and the light source are provided adjacent to one another in a common light source package. A flat tilted window, which typically includes a partially reflective coating, is often provided above the back monitor photo detector and the light source and reflects a portion of the light beam from the light source to the back monitor photo detector. A controller receives a signal from the back monitor photo detector, and provides a control signal to the light source to stabilize the output power of the light source over a range of operating conditions.

In many systems, a lens is provided outside of the light source package to help direct the light beam to a desired destination such as an optical detector, optical fiber, or some other destination. The lens can, for example, focus the light beam onto a detector, an input facet of an optical fiber, or some other desired destination.

Thus, in many optical systems, both a partially reflective window and a separate lens are provided in the path of the light beam. Having to manufacture and mount both of these separate components can increase the cost of the system. In addition, and in some application, there is insufficient room between the light source and the desired destination to accommodate both a partially reflective window and a separate lens.

What would be desirable, therefore, is a lens that includes a reflective surface. In some applications, such a lens could replace both the partially reflective window and the lens, thereby providing significant cost savings. In addition, the complexity associated with mounting both the partially reflective window and the lens could be reduced, and the size and/or spacing requirements between the light source and the desired destination may be reduced. All of these may result in more desirable optical systems.

SUMMARY

Generally, the present invention relates to a lens having a reflective surface, as well as systems that use such lenses. More specifically, the present invention relates to a lens that includes a transmissive part for passing a portion of an incident light beam, and a reflective part for reflecting a portion of the incident light beam. The reflective part is preferably substantially non-transmissive.

In one illustrative embodiment, the lens includes a first lens surface and an opposing second lens surface, and the reflective part covers less than half of the surface area of the first lens surface. The reflective part may cover significantly less than half of the surface area of the first lens surface, such as less than 25% or 10% of the surface area of the first lens surface. Rather than specifying a surface area, it is contemplated that the reflective part may reflect less than 50%, and sometimes less than 25%, and sometimes less than 10% of the optical power of the light beam that is incident on the first lens surface.

In some embodiments, the reflective part is adapted to focus the reflected light on a predetermined area or location, such as the sensitive area of a back monitor photo detector. By focusing the reflected light, the size of the back monitor photo detector may be reduced. In some cases, the first lens surface is convex, and the reflective part is a concave surface inset into the convex surface, but this is not required in all embodiments. The perimeter of the reflective part may have any desired shape, such as rectangular, circular, elliptical, annular, etc. In some embodiments, the lens is molded using a substantially transparent material, with the reflective part having a reflective coating applied thereto.

In some cases, the numerical aperture of the light source may change under different operating conditions. As such, it is contemplated that that the reflective part may be configured to reflect a relatively constant percentage of the output power of the light beam over a range of numerical apertures. In some illustrative embodiments, this may be accomplished by having the reflective part of the lens extend from at or near the center of the illumination beam pattern on the lens to at or near an expected outer perimeter of the illumination pattern. Thus, regardless of the numerical aperture of the light source, a relatively constant percentage of the output power of the light beam may be reflected.

The present invention contemplates that the above lens may be used in a wide variety of applications including telecommunication, computer, control, sensor, manufacturing, and/or any other suitable application. In some applications, a light beam having a controlled output power may be desirable. To produce a controlled light beam, a light source, a photo detector and a lens having a reflective part may be provided. In one illustrative embodiment, the light source and photo detector may be positioned adjacent to one another, and the lens may be spaced from both the light source and photo detector. The lens may be in the light beam path of the light source. In one illustrative embodiment, the lens passes most of the light beam to a desired destination such as a photo detector, optical fiber, or any other desired destination.

The reflective part of the lens reflects a portion of the light beam back to a photo detector. A controller, which is coupled to the photo detector and the light source, receives a signal from the photo detector that is indicative of the amount of light detected by the photo detector. The controller provides a control signal to the light source that adjusts the power of the light source such that the signal from the photo detector (and thus the power of the light beam) is relatively constant.

The fraction of light that is reflected to the photo detector may be determined by the size, shape and position of the reflective part. The shape may be configured to couple a relatively constant fraction of the light from the light source to the photo detector, even though the numerical aperture of the light source may change due to different operating conditions. This may provide a substantially constant tracking ratio. In addition, and as noted above, the reflective part may be shaped to provide a suitable focal length to focus the reflected light onto the photo detector. The ability to focus the reflected light onto the photo detector may allow for a smaller photo detector, which may reduce the cost of the optical system.

DETAILED DESCRIPTION

Figure 1:
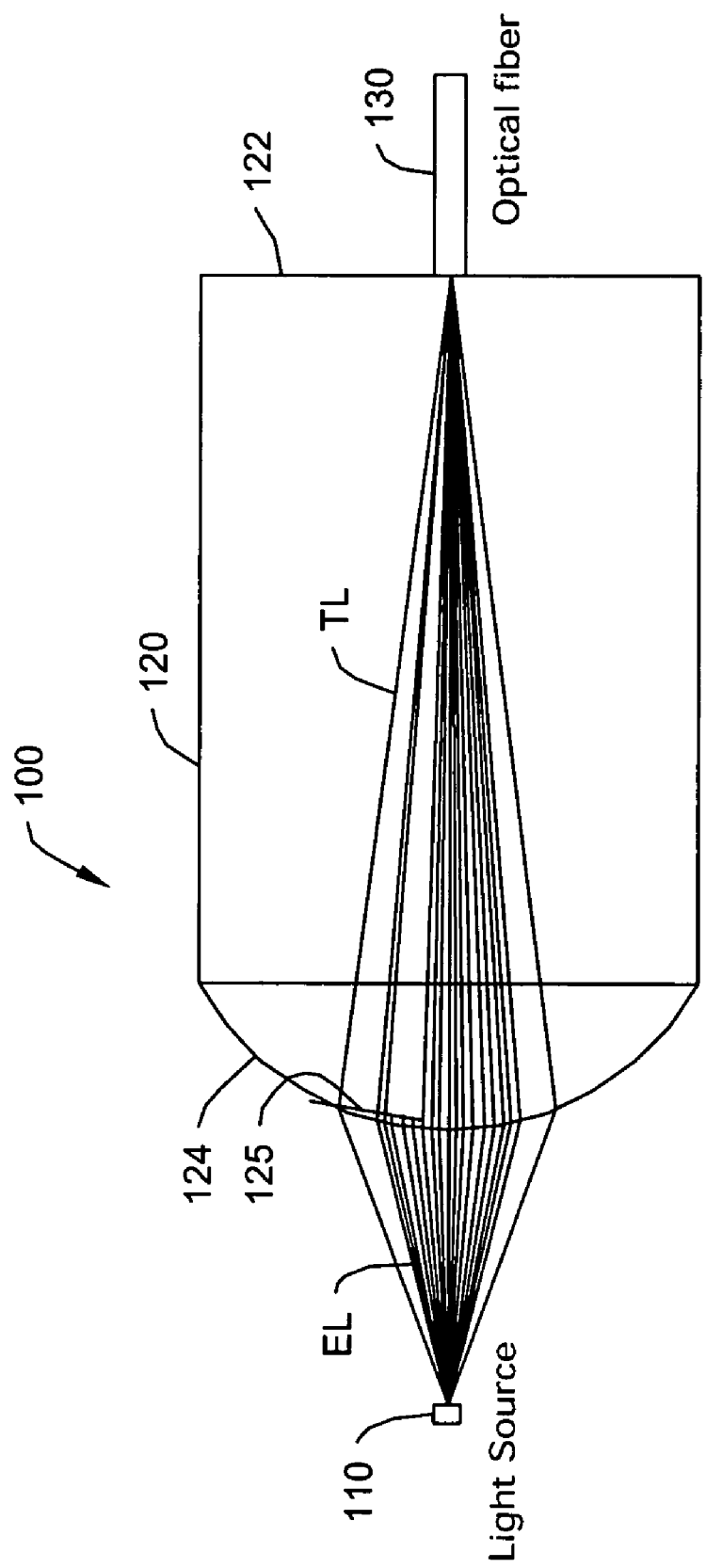
FIG. 1 is a schematic view of an optical system according to an illustrative embodiment of the present invention.
Figure 2:
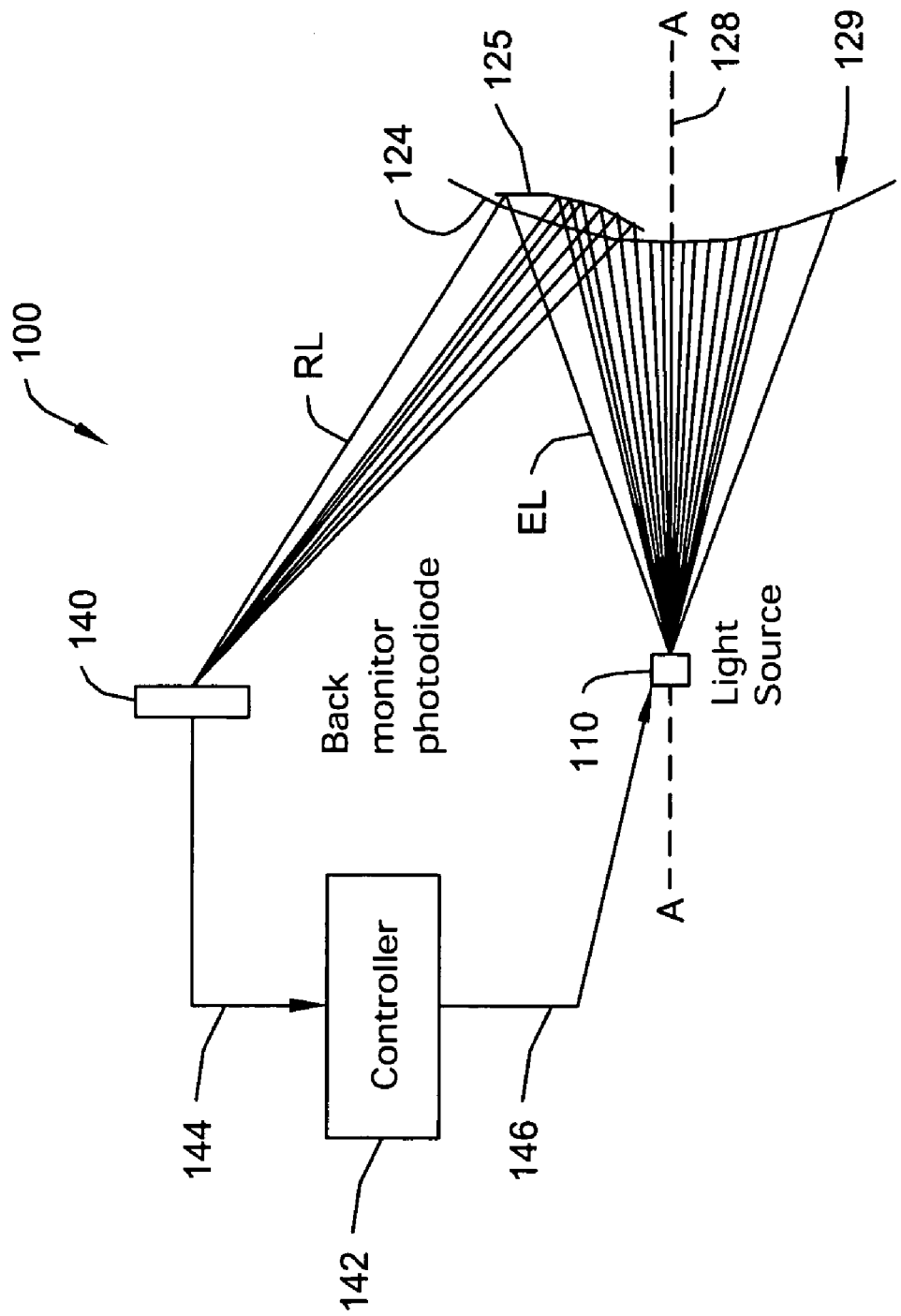
FIG. 2 is a schematic view including a ray trace of the reflected light in the illustrative embodiment of FIG. 1.

Throughout the Description, like components will be identified by like reference numerals and letters. FIGS. 1 and 2 illustrate an optical system 100 according to one illustrative embodiment of the present invention. The system 100 includes a light source 110, an optical element 120, an optical fiber 130, a back monitor photo detector 140, and a controller 142. In the illustrative embodiment, the light source 110 and the photo detector 140 are positioned adjacent to one another (see FIG. 2), and the lens 120 is spaced above both the light source 110 and photo detector 140 to receive the light beam of the light source 110. In the illustrative embodiment, the back monitor photo detector 140 has a sensitive area of about 80 um, and has a closest edge laterally spaced from the light source 110 by about 300 um.

As can be seen, the illustrative optical element 120 includes an integrated reflective surface 125. Emitted light (EL) from the light source 110 strikes the optical element 120 in a light pattern, and most of the emitted light (EL) passes through the optical element 120 as transmitted light (TL) to optical fiber 130. In the illustrative embodiment, the optical element 120 focuses the transmitted light (TL) onto the input facet of the optical fiber 130. While an optical fiber 130 is shown, it is contemplated that the optical element 120 may be used to direct the transmitted light (TL) to any desired destination, depending on the application.

The optical element 120 may be an integrated micro lens similar to that described in U.S. patent application Ser. No. 10/622,042, entitled "OPTICAL COUPLING SYSTEM", filed Jul. 17, 2003, owned by the assignee of the present application, and which is herein incorporated by reference. The integrated micro lens may be made of a suitable plastic such as Ultm®, which is a General Electric Company plastic. In some cases, the lens may be made by injection molding. In the illustrative embodiment, the lens is a plano-convex lens and has a length of about 828 um and is placed about 300 um from the light source 110, which in some cases may be a Vertical Cavity Surface Emitting Laser (VCSEL). The optical fiber 130 may be, for example, a single mode optical fiber that is butt coupled to the flat surface 122 of the plano-convex optical element 120. To reduce back reflection caused by the interface between the optical element 120 and the optical fiber 130, the index of refraction of the material used for the optical element 120 may be substantially matched to the index of refraction of the material used for the core of the optical fiber 130.

In the illustrative embodiment, the optical element 120 includes an input surface 124 and an output surface 122. The input surface 124 is shown generally as a convex shape and the output surface 122 is shown generally as a flat surface. This is only one illustrative embodiment, however. In other illustrative embodiments, the shape of the input surface 124 and the output surface 122 may be: (1) both concave; (2) both convex; (3) one convex and the other concave; (4) one flat and the other concave; (5) one flat and the other convex; or (5) or any other shape as desired, depending on the application.

In the illustrative embodiment, the input surface 124 includes a reflective surface 125. The optical element 120 may be a molded lens, and the reflective surface 125 may be molded into the surface of the molded lens. To make the reflective surface 125 reflective, a reflective coating may be applied to the reflective surface 125. In one illustrative embodiment, the reflective surface 125 is coated with a noble metal such as gold. Other coatings may include, for example, aluminum or any other reflective coating. The reflective surface 125 is preferably substantially non-transparent to the emitted light (ET), while the remaining portion of the input surface 124 is substantially transparent to the emitted light (ET).

Figure 16:
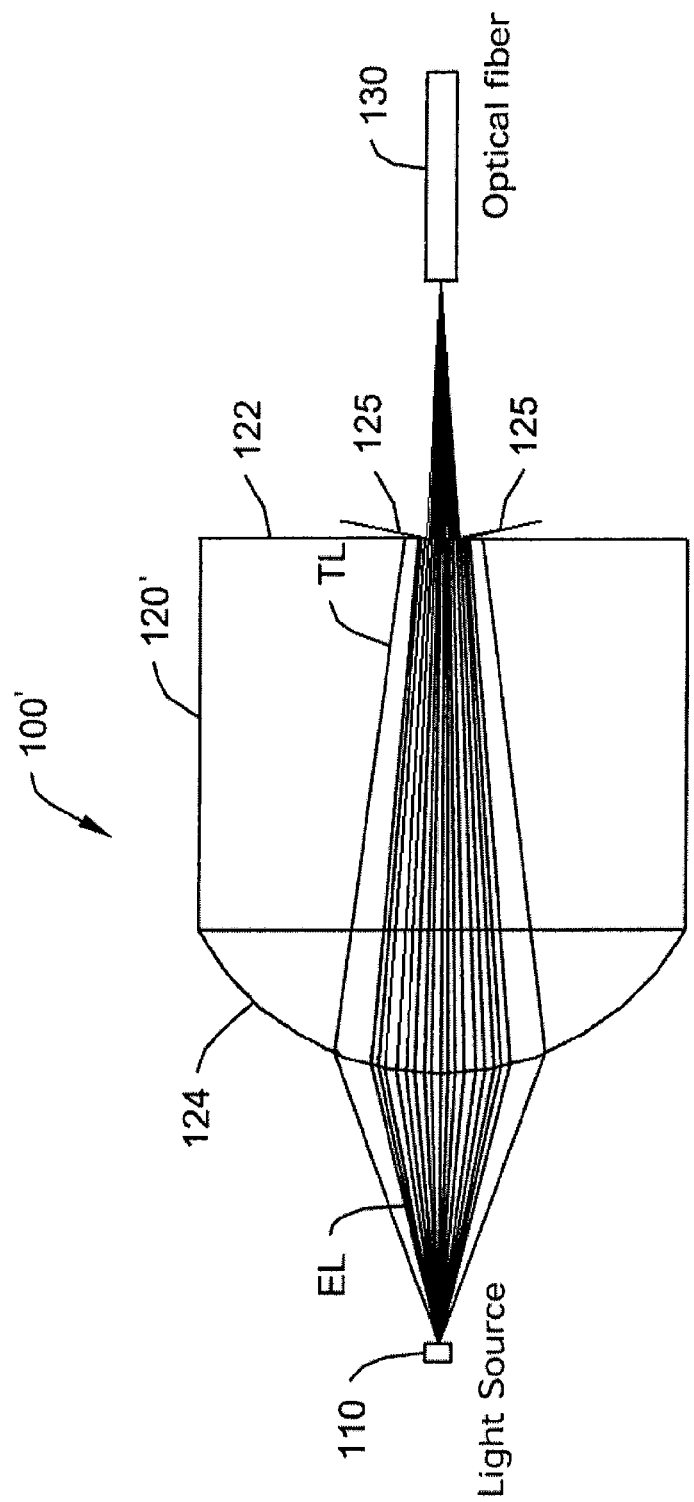
FIG. 16 is a schematic view of an alternative optical system according to an example embodiment of the present invention.
Figure 17:
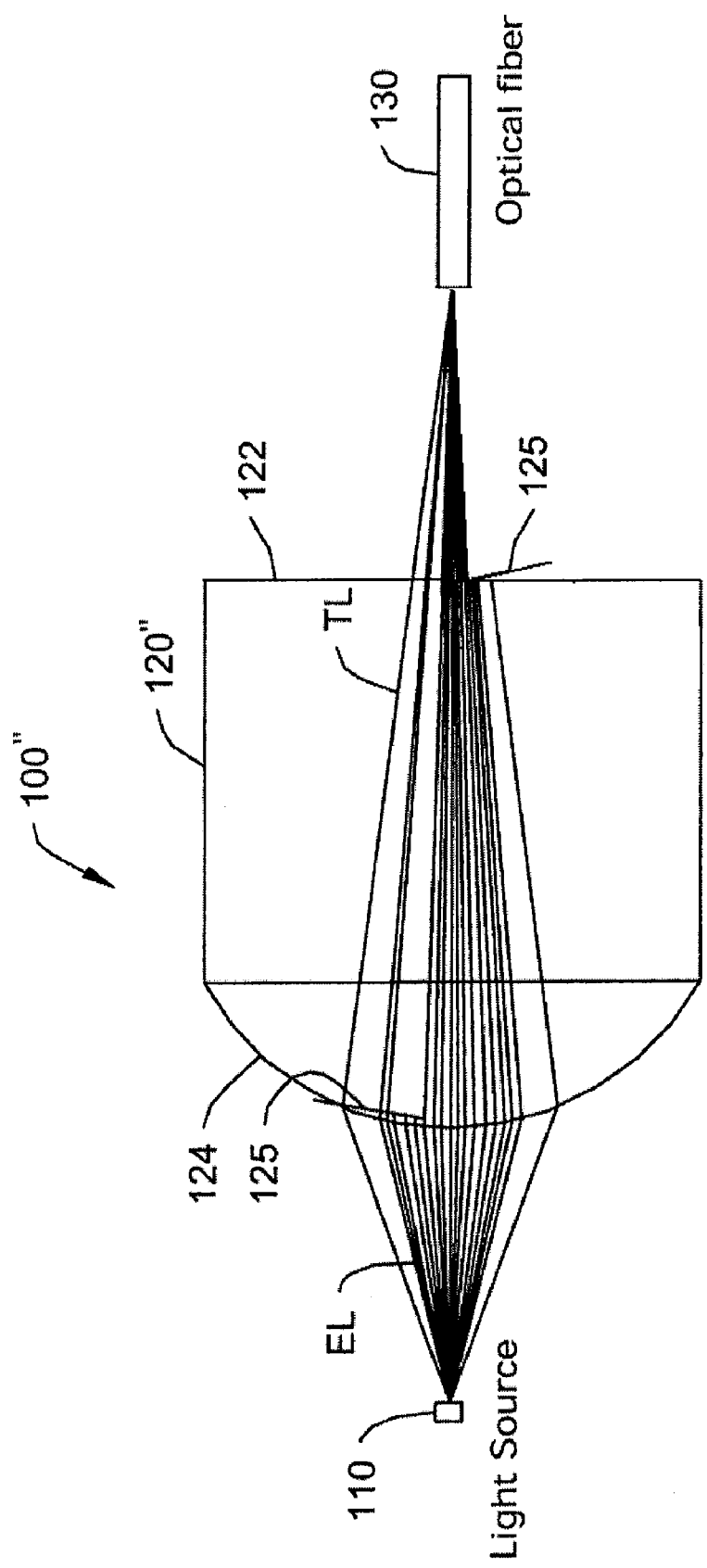
FIG. 17 is a schematic view of another alternative optical system according to an example embodiment of the present invention.
Figure 18:
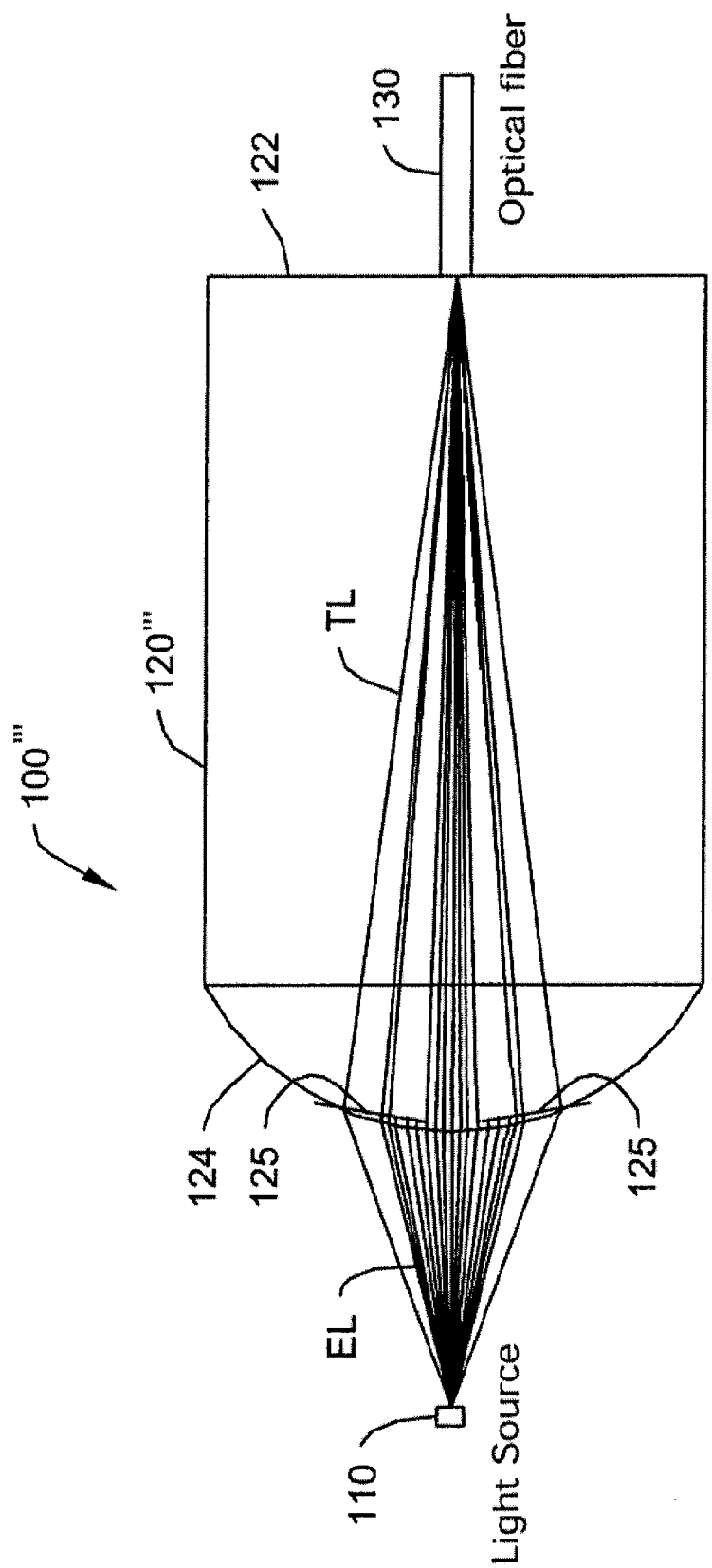
FIG. 18 is a schematic view of yet another alternative optical system according to an example embodiment of the present invention.
Figure 19:
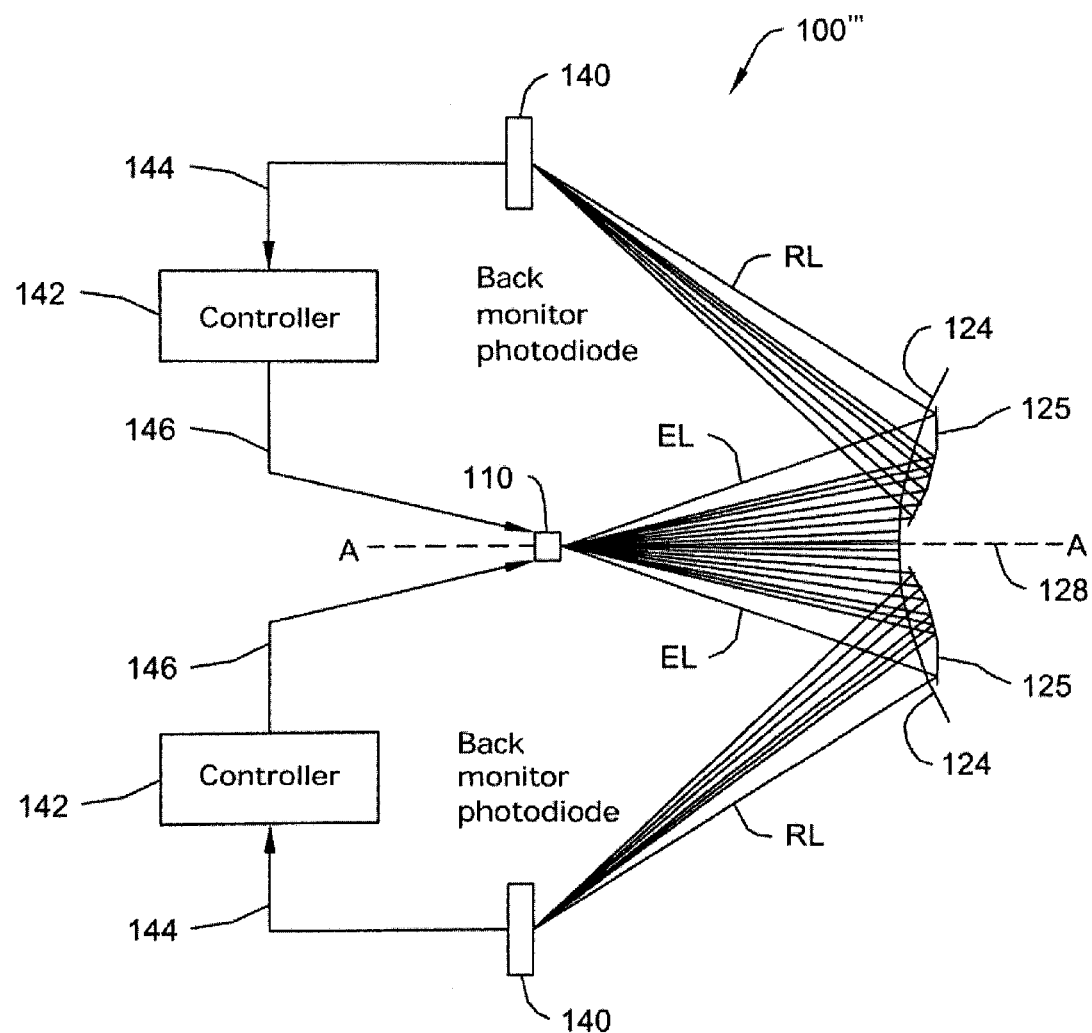
FIG. 19 is a schematic view including a ray trace of the reflected light in the example embodiment of FIG. 18.
Figure 21:
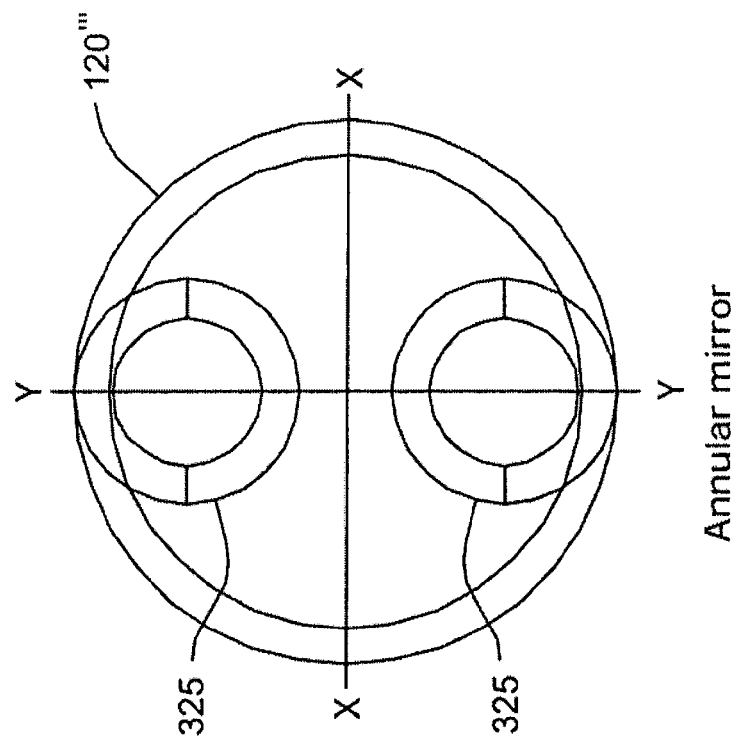
FIGS. 20 and 21 are schematic views of example embodiments of reflective surfaces of a lens according to example embodiments of the present invention.
Figure 20:
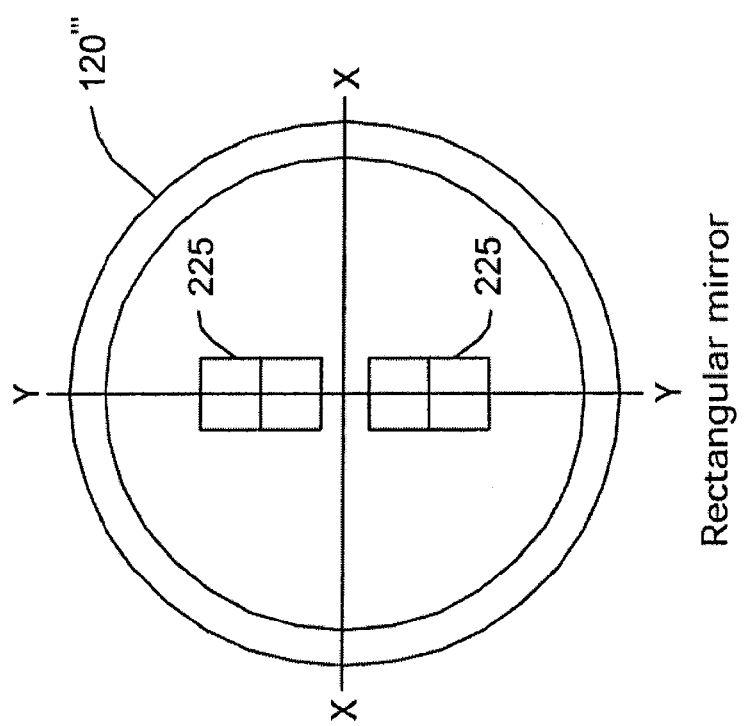
Figure 22:
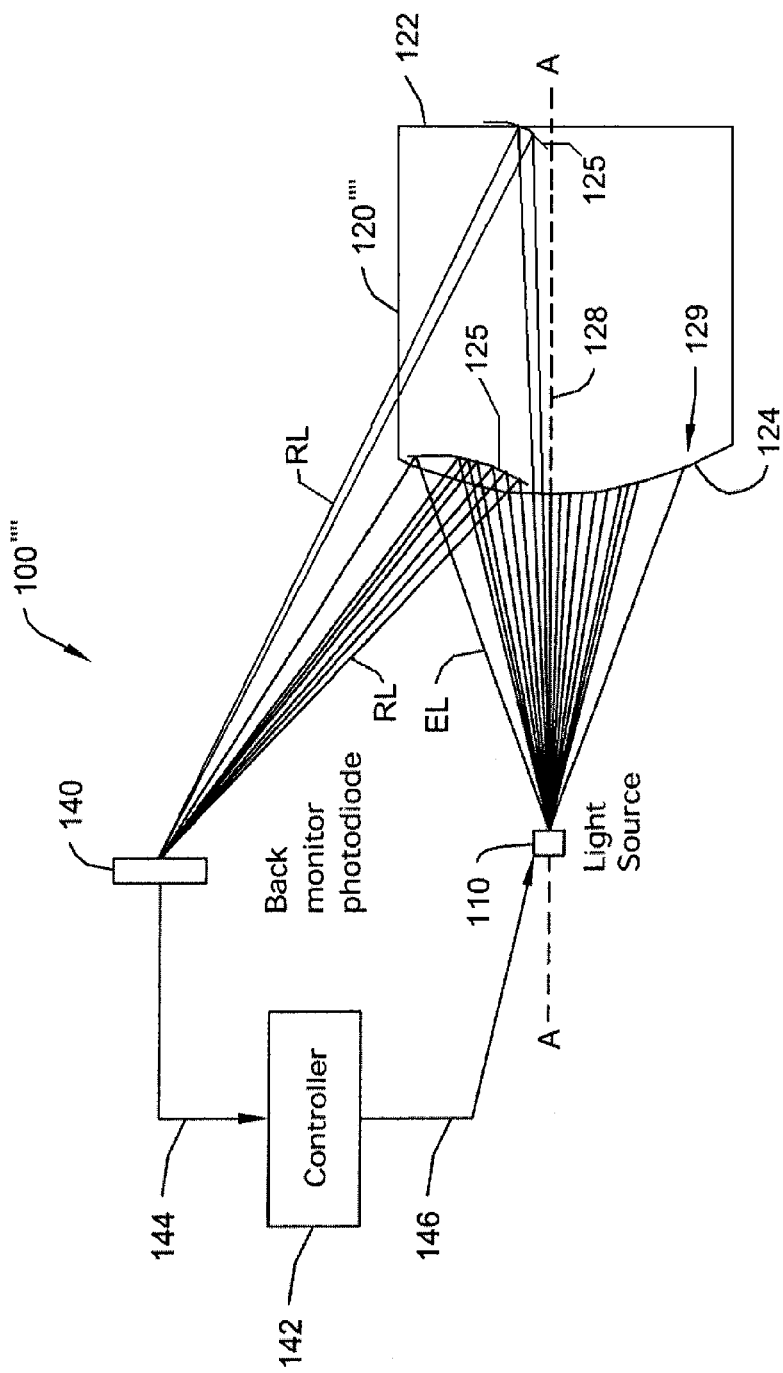
FIG. 22 is a schematic view including a ray trace of the reflected light of one example embodiment of the present invention.
Figure 23:
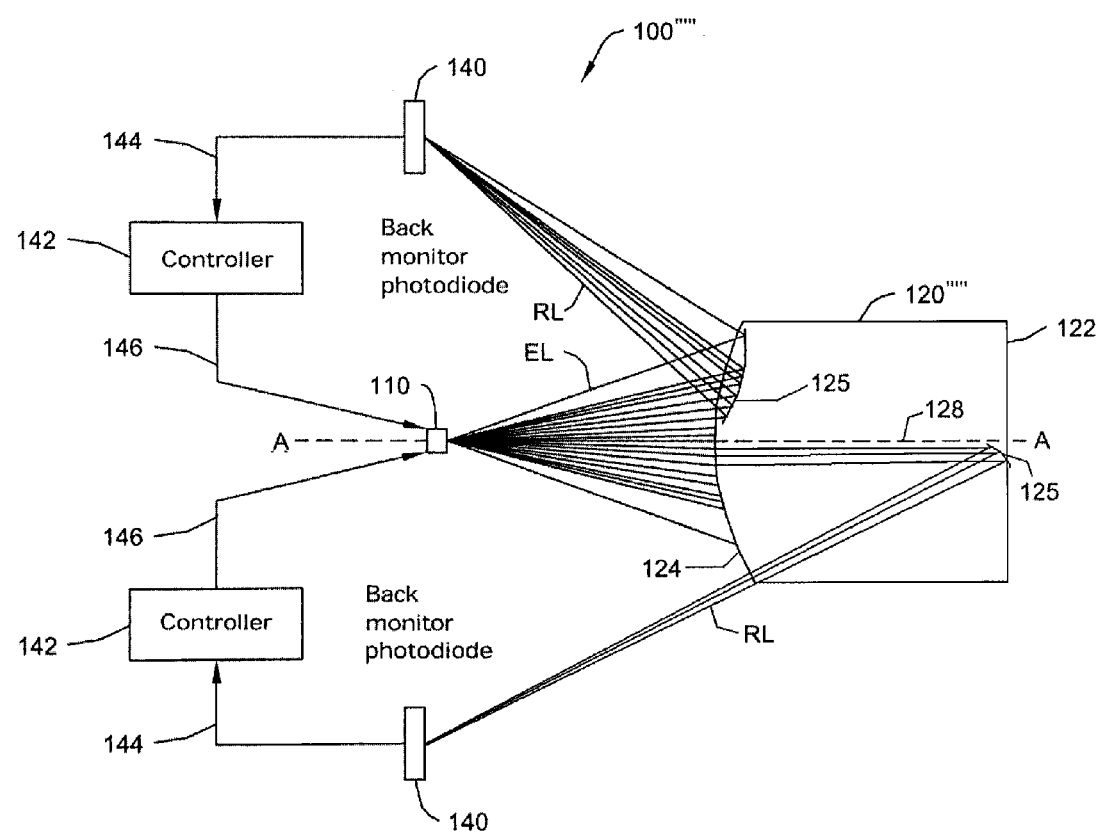
FIG. 23 is a schematic view including a ray trace of the reflected light in the example embodiment of FIG. 17.

In the illustrative embodiment, the reflective surface 125 covers less than half of the input surface of the optical element 120, and directs a substantially constant fraction of the output power from the light source 110 to a photo detector 140 (see FIG. 2). In some cases, the reflective surface 125 covers less than 25% of the input surface 124 of the optical element 120, and in other cases, less than 10%. While the reflective surface is shown on the input surface 124 of the optical element 120, it is contemplated that the reflective surface 125 may be on the output surface 122 of the optical element 120 (see the alternative optical element 120' of the alternative optical system 100' of FIG. 16), or on both the input surface 124 and output surface 122 (see the alternative optical element 120" of the alternative optical system 100" of FIG. 17), as desired. In addition, it is contemplated that either or both of the input surface 124 or output surface 122 may have more than one reflective surface 125 (see the alternative optical element 120''' of the alternative optical system 100''' of FIGS. 18-21), if desired. When more than one reflective surface 125 is provided on the optical element 120, selected reflective surfaces may be adapted to reflect the light to either a common location (see the alternative optical element 120'''' of the alternative optical system 100'''' of FIG. 22) or different locations (see the alternative optical system 100'''' of FIG. 19 as well as the alternative optical element 120'''' of the alternative optical system 100'''' of FIG. 23), as desired.

In some embodiments, the reflective surface 125 is adapted to focus the reflected light onto a predetermined spot or area, such as the sensitive area of a back monitor photo detector 140 (see FIG. 2). By focusing the reflected light, the size of the back monitor photo detector 140 may be reduced. In some cases, the input surface 124 is convex, and the reflective surface 125 is a concave surface inset into the convex input surface 124, but this is not required in all embodiments. The reflective surface 125 may have a perimeter of any desired shape including, for example, rectangular, circular, elliptical, annular, etc.

In some cases, the numerical aperture of the light source 110 may change under different operating conditions. For example, when the light source 110 is a Vertical Cavity Surface Emitting Laser (VCSEL), the numerical aperture may change as a function of output power, temperature, as well as other factors. To help reduce the dependence of the tracking ratio on the numerical aperture of the light source 110, it is contemplated that that the reflective surface 125 may be configured to reflect a relatively constant percentage of the emitted light (EL) beam, over a predetermined range of numerical apertures. This may be accomplished by, for example, having the reflective surface 125 of the optical element 120 extend from at or near a central axis 128 of the emitted light (EL) pattern on the input surface 124 of the optical element 120 to at or near an expected outer perimeter 129 of the emitted light (EL) pattern. This works especially well if the emitted light (EL) pattern is symmetrical in at least one dimension about the central axis 128.

A controller 142 may also be provided. In the illustrative embodiment, the controller 142 may be coupled to the light source 110 and the back monitor photo detector 140. The controller 142 receives a signal 144 from the back monitor photo detector 140 that is indicative of the amount of light detected by the back monitor photo detector 140. The controller 142 then provides a control signal 146 to the light source 110 that adjusts the power of the light source 110 such that the signal 144 from the back monitor photo detector 140, and thus the power of the emitted light (EL), is relatively constant.

The fraction of light that is reflected to the back monitor photo detector 140 may be determined by the size, shape and position of the reflective surface 125. The shape and position may be configured to couple a relatively constant fraction of the emitted light (EL) to the back monitor photo detector 140, even when the numerical aperture of the light source 110 changes due to different operating conditions, thereby providing a substantially constant tracking ratio. In addition, and as noted above, the reflective surface 125 may be shaped to provide a suitable focal length to focus the reflected light (RL) onto the back monitor photo detector 140. The ability of the reflective surface 125 to focus the reflected light (RL) onto the back monitor photo detector 140 may allow for a smaller back monitor photo detector 140, which may reduce the size and cost of the system.

Figure 4:
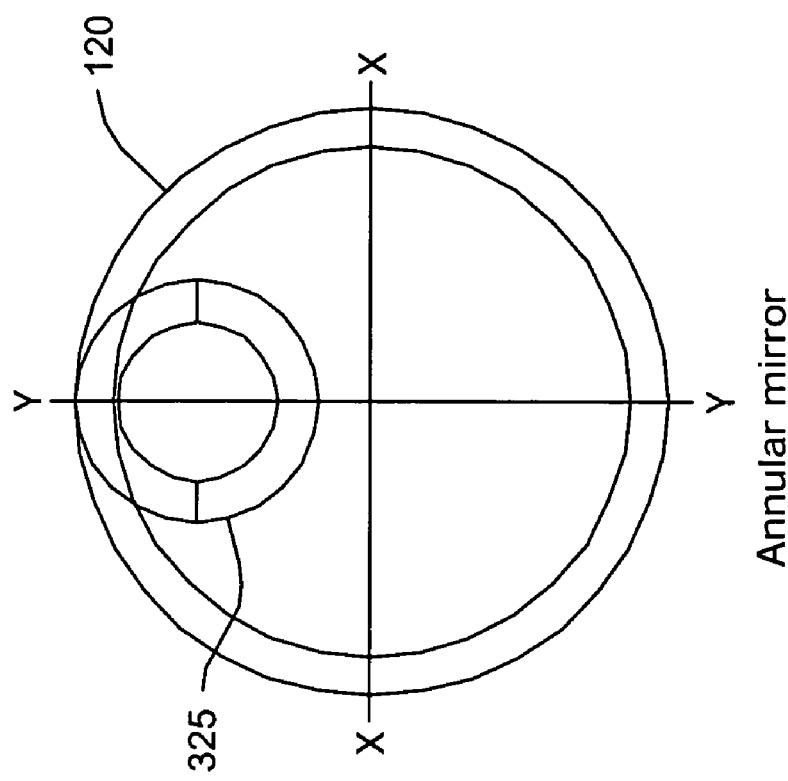
FIGS. 3 and 4 show alternative illustrative embodiments of a reflective surface of a lens in accordance with the present invention.
Figure 3:
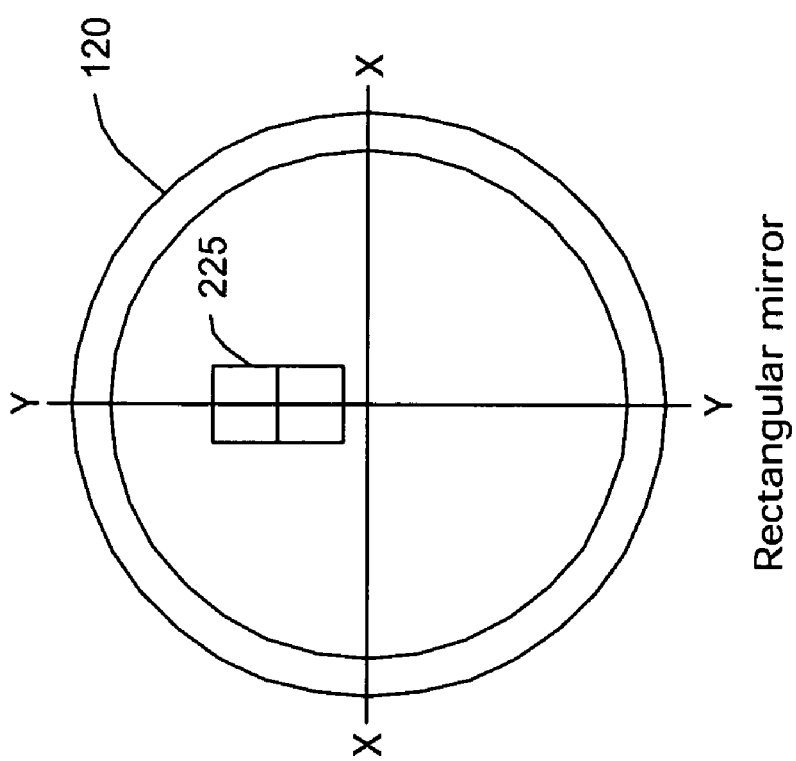
Figures 5, 6:
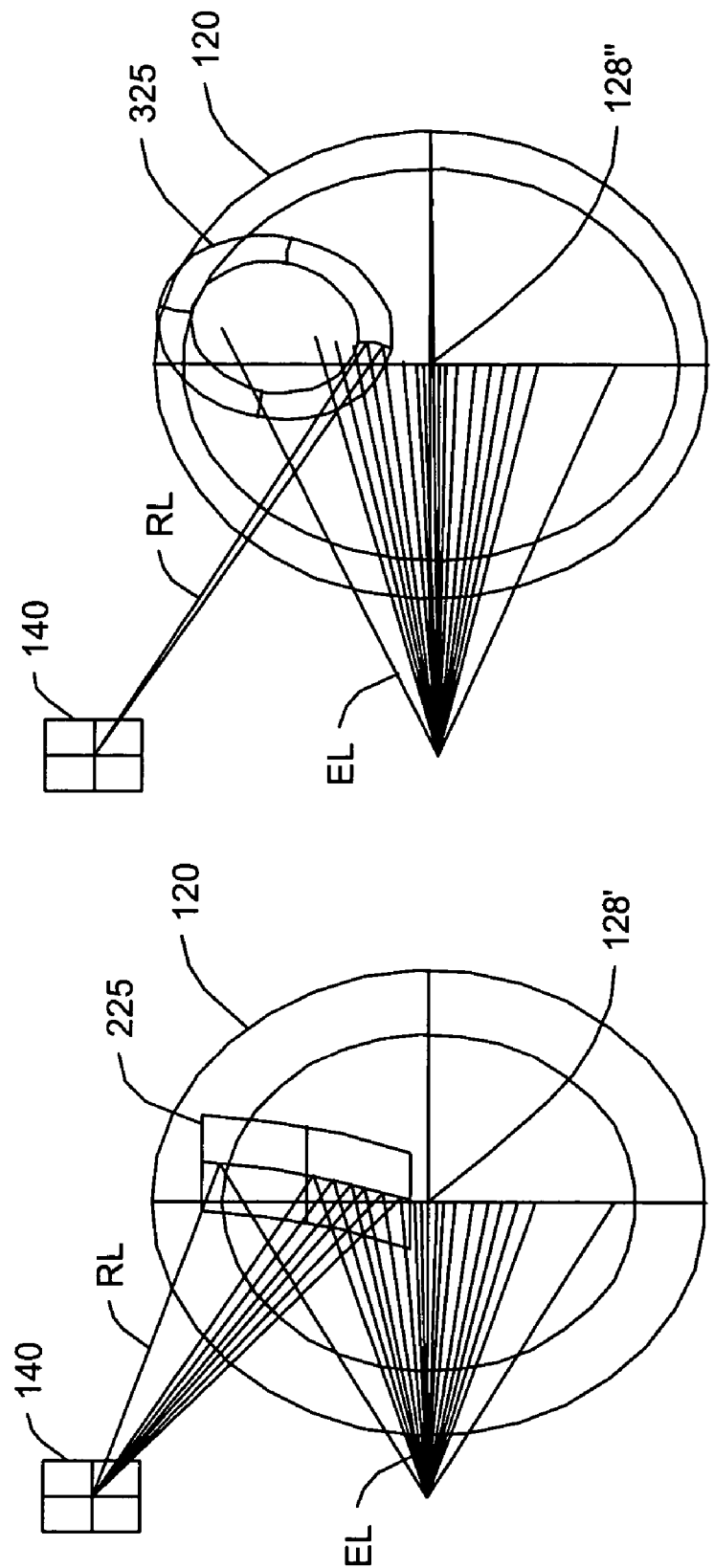
FIGS. 5 and 6 are illustrative off-axis ray tracing diagrams showing the reflected light path for the reflective surfaces of FIGS. 3 and 4, respectively.

FIGS. 3 and 4 show alternative illustrative embodiments of reflective surfaces for an optical element 120 in accordance with the present invention. FIG. 3 shows a rectangular shaped reflective surface 225, and FIG. 4 shows an annular shaped reflective surface 325. In the illustrative embodiment, the reflective surfaces 225 and 325 are centered on the X axis and offset on the Y axis, however, this is not required in all embodiments. FIGS. 5 and 6 illustrate the different patterns of reflected light (RL) created by the rectangular 225 and annular 325 shaped reflective surfaces of FIGS. 3 and 4, respectively.

Referring to FIGS. 5 and 6, the emitted light (EL) in the illustrative embodiment engages the optical element 120 in a pattern that is symmetrical about the central axis of the optical element 120. FIGS. 5 and 6 are off-axis views. The optical element 120 passes a desired amount (e.g. a majority) of the emitted light (EL) light to the optical fiber 130 (see FIG. 1), while the corresponding reflective surface 225 or 325) is adapted to reflect a desired amount of the emitted light (EL) to back monitor photo detector 140 (see FIG. 2). Possible shapes for the reflective surfaces include, but are in no way limited to, polygonal, circular, elliptical, annular, etc.

As can be seen in FIGS. 5 and 6, the reflective surfaces 225 and 325 may extend from at or near a central axis (see 128' and 128") of the emitted light (EL) beam pattern to at or near an expected outer perimeter of the emitted light (EL) beam pattern. This may provide a relatively constant percentage of the output power of the emitted light (EL) beam to the back monitor photo detector 140 over a range of numerical apertures of the light source 110.

Figure 8:
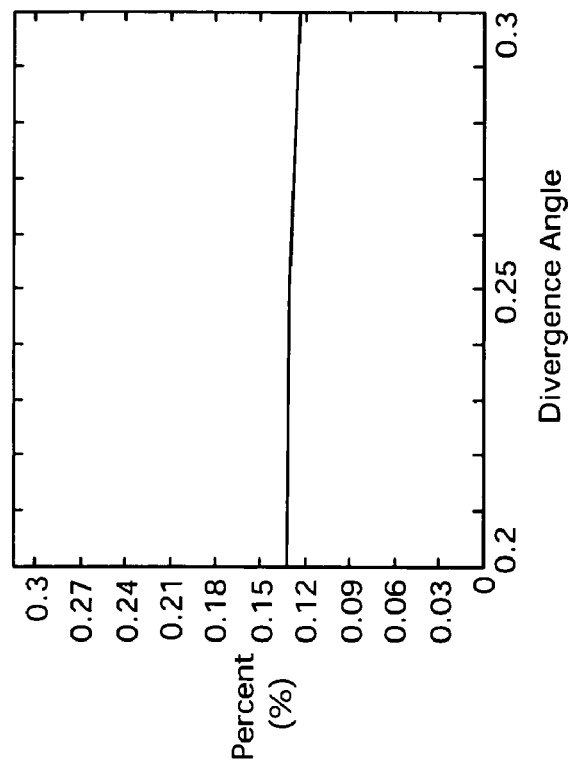
FIGS. 7 and 8 are graphs showing the percent of signal on the photo detector versus angular divergence (NA) for the reflective surfaces of FIGS. 3 and 4, respectively.
Figure 7:
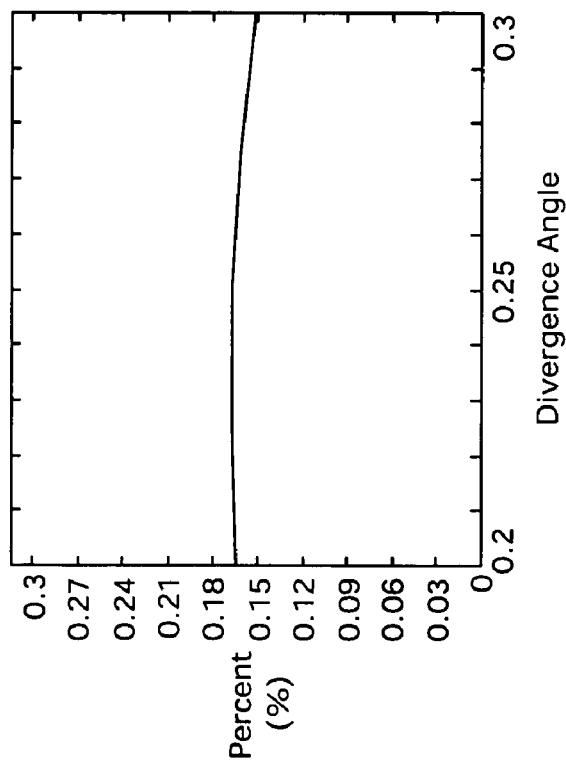
Figure 10:
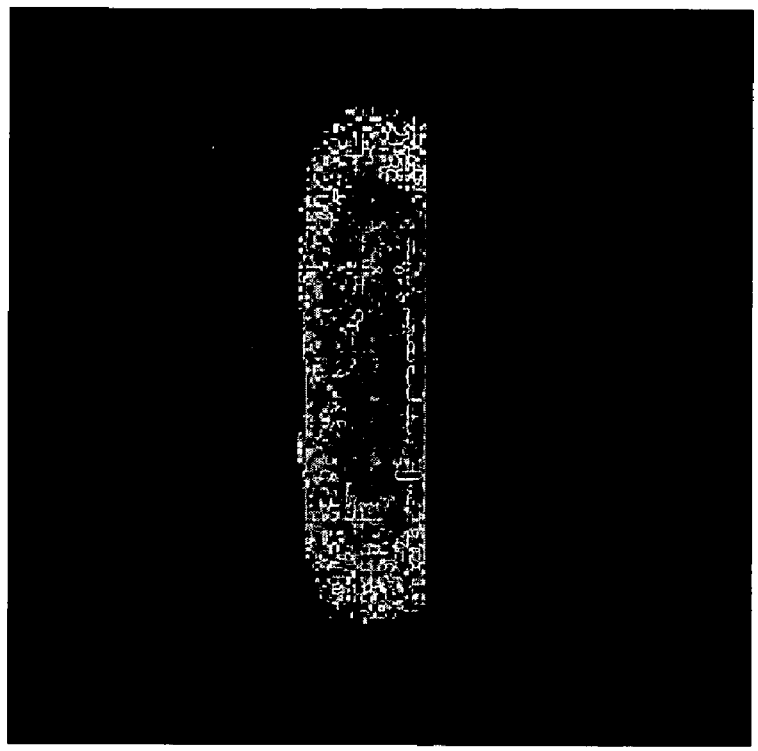
FIGS. 9 and 10 are image spots on a back-monitor photo diode for the reflective surfaces of FIGS. 3 and 4, respectively.
Figure 9:
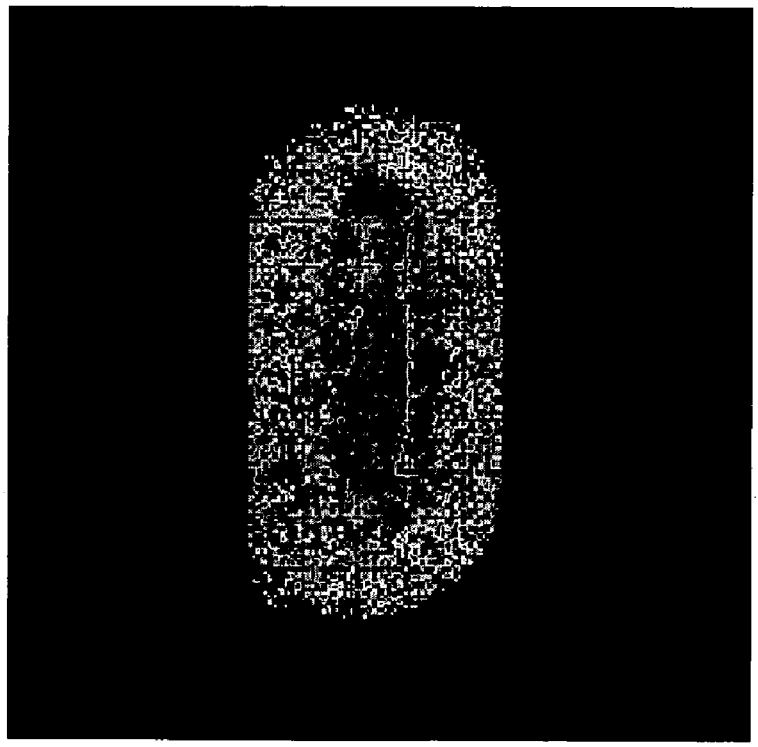

FIGS. 7 and 8 are graphs showing the percent of signal on the back monitor photo detector 140 versus angular divergence (NA) of the light source for the reflective surfaces of FIGS. 3 and 4, respectively. As can be seen, the shape and placement of the reflective surfaces 225 and 325 shown in FIGS. 5 and 6, respectively, cause a relatively constant percent of emitted light (EL) to be reflected back to the back monitor photo detector 140 over a range of divergence angles (or numerical apertures) of a VCSEL light source 110. FIGS. 9 and 10 show image spots on the back monitor photo detector 140 using the reflective surfaces 225 and 325 of FIGS. 3 and 4, respectively. In the illustrative embodiment, the black squares shown in FIGS. 9 and 10 correspond to an 80 um square sensitive area of an illustrative back monitor photo detector.

Figure 12:
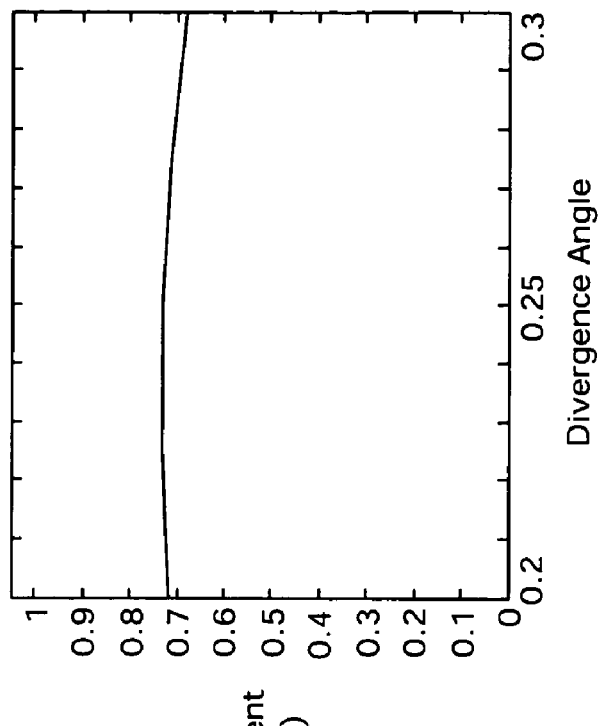
FIGS. 11 and 12 are graphs showing the single mode fiber coupling efficiency versus angular divergence (NA) for the reflective surfaces of FIGS. 3 and 4, respectively.
Figure 11:
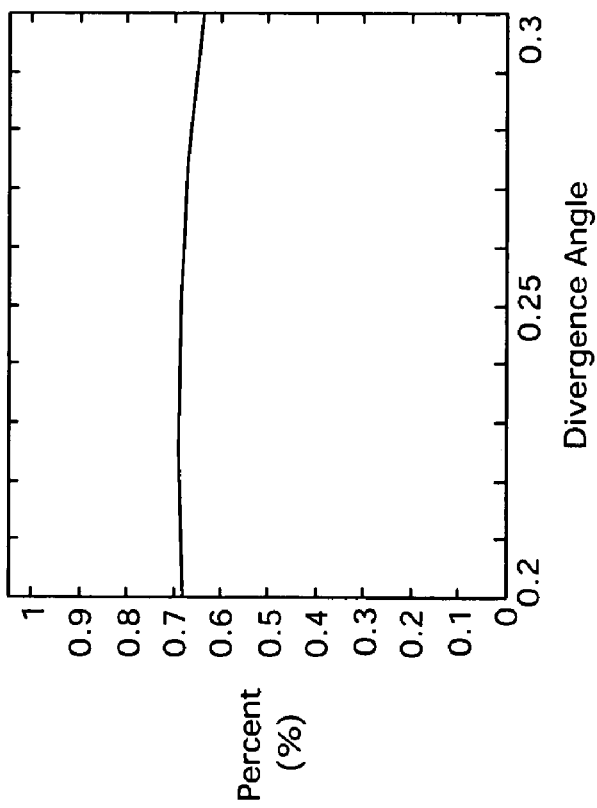

FIGS. 11 and 12 are graphs showing a single mode fiber coupling efficiency versus angular divergence (NA) of the light source for the reflective surfaces 225 and 325 of FIGS. 3 and 4, respectively. As can be seen, the rectangular 225 and annular 325 shaped reflective surfaces both provide a relatively constant coupling efficiency into a single mode fiber 130 over a range of divergence angles (or numerical apertures) of a VCSEL light source 110.

Figure 14:
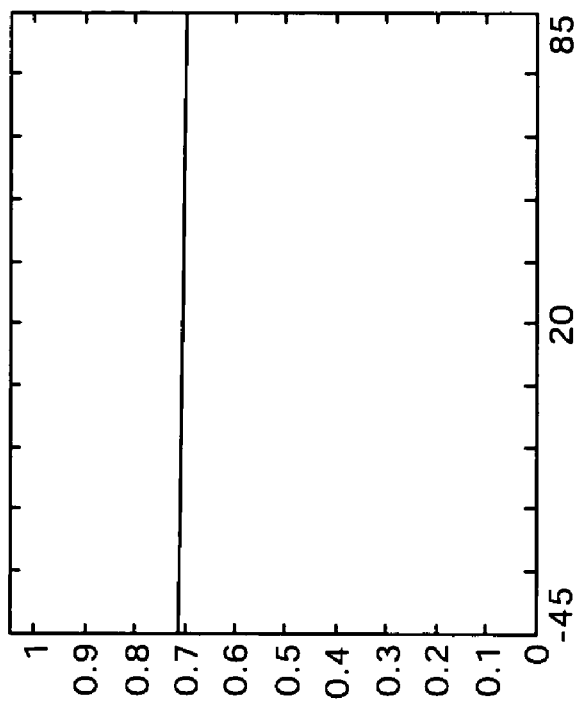
FIGS. 13 and 14 are graphs showing the single mode fiber coupling efficiency versus temperature in degrees Celsius for the reflective surfaces of FIGS. 3 and 4, respectively.
Figure 13:
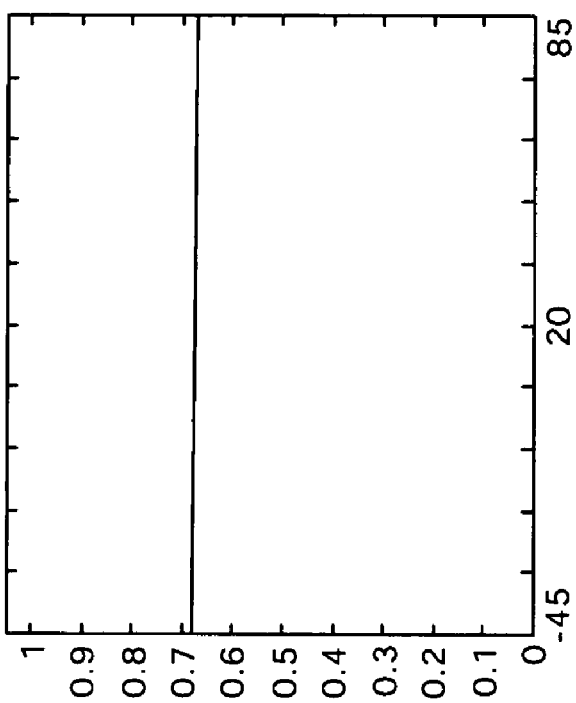
Figure 15:
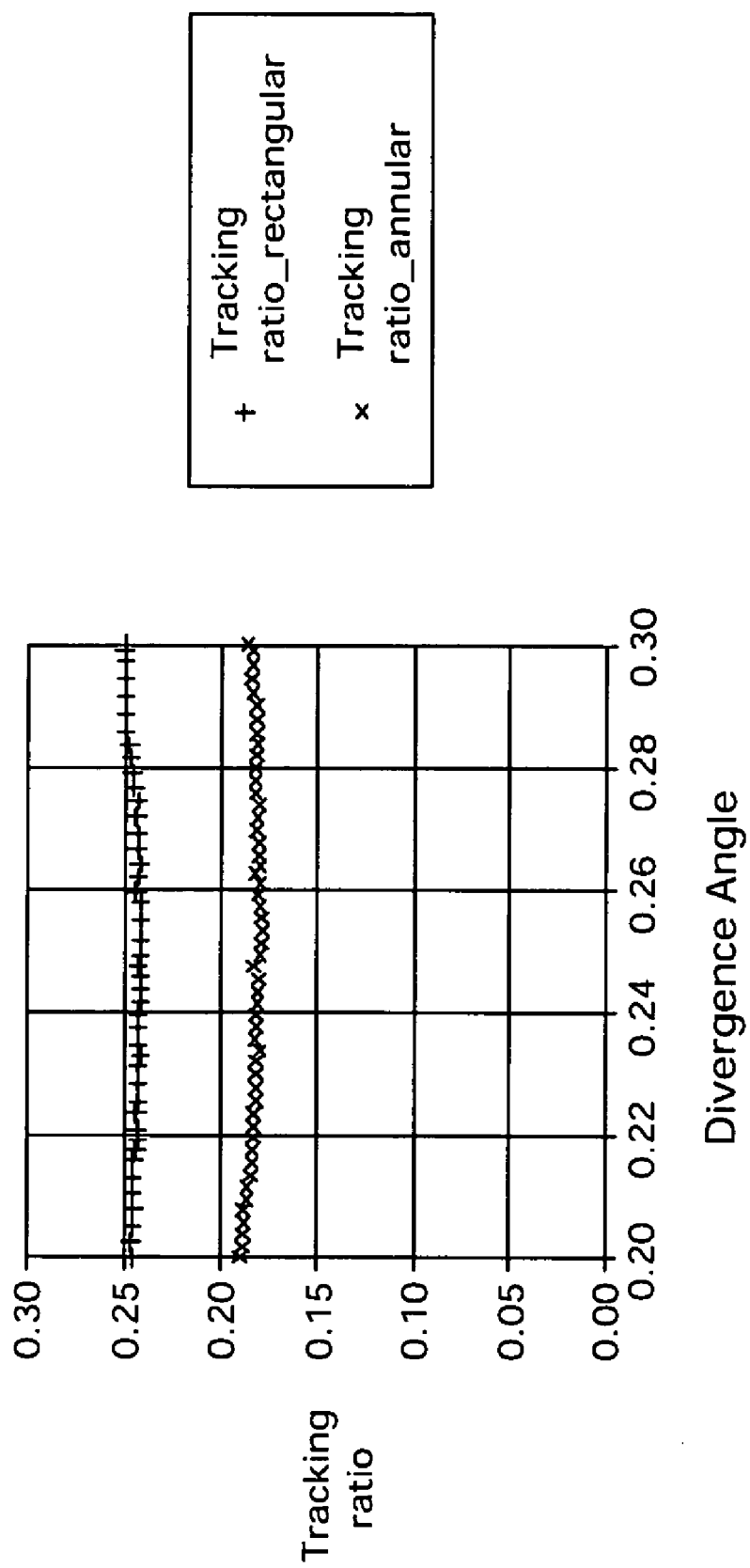
FIG. 15 is a graph showing the tracking ratios versus angular divergence (NA) for the reflective surfaces of FIGS. 3 and 4.

FIGS. 13 and 14 are graphs showing the relatively constant single mode fiber coupling efficiency achieved over a relatively wide temperature range with the reflective surfaces 225 and 325 of FIGS. 3 and 4, respectively. FIG. 15 is a graph showing the relatively constant tracking ratios achieved with the rectangular 225 and annular 325 reflective surfaces of FIGS. 3 and 4, respectively, over a range of divergence angles (or numerical apertures) of a VCSEL light source 110.

In one illustrative example of the present invention, the photodetector 140 is a back monitor photodiode, and the reflective surface 125 couples a specified minimum amount of power to the back monitor photodiode 140. In the particular embodiment shown in FIGS. 1 and 2, the laser light source 110 may be a VCSEL positioned 300 um in front of optical element 120, which is 828 um long and abuts single mode optical fiber 130. The reflective surface 125 is inset into the input surface of the optical element 120, and has a height of about 100 um, although other dimensions may be used. The back monitor photodiode 140 is positioned 300 um in a lateral direction from the VCSEL, and the sensitive area of the photodiode 140 is 80 um square.

In the illustrative example, the reflective surface 125 focuses sufficient light to induce a photocurrent of at least 50 uA in the photodiode 140 when the VCSEL 110 is coupled to a single mode fiber 130 and the laser 110 is operating at the desired power level. In one embodiment, the reflective surface 125 is adapted to reflect about 23% of the laser power to the photodetector 140. With a back monitor photodiode responsivity of 0.8 A/W, the back monitor current is about 94 uA for 0.5 mW of laser power coupled to the optical fiber.

The tracking ratio is the ratio of laser power that is coupled to the optical fiber 130 versus the laser power reflected to the back monitor photodiode 140. It is generally desired to have an essentially constant tracking ratio over temperature and process variation. The reflective surface 125 may help provide such a tracking ratio. Different process runs produce VCSELs with slightly different numerical apertures (NA). The numerical aperture (NA) of a given VCSEL is also a function of temperature, output power, and other factors. The shape and location of the reflective surface 125 may be selected to provide a constant tracking ratio over a given range of numerical aperture (NA) values.

In one embodiment, a VCSEL 110 and back monitor photodiode 140 require a minimum spacing between the two components. Additionally, in order to reduce the cost of the photodiode, the size of the photodiode chip may be minimized. In such a system, the size and shape of the reflective surface 125 may be configured to focus the reflected light onto the photodiode 140. In one example, such as is illustrated in FIG. 2, the distance between the VCSEL lasing area and the center of the photodiode active area may be about 340 um, while other distances may be used.

The surface area of the optical element 120 that is obscured by the reflective surface 125 changes the beam shape at the input surface of the optical fiber 130. This change in beam shape introduces an additional loss of coupling due to the mismatch between the modified VCSEL mode and the mode of the single mode fiber. For a particular application, the area of the reflective surface 125 should be minimized so that this beam shape distortion and additional coupling loss is minimized. For the design shown in FIGS. 1 and 2, about 69% of the VCSEL laser power is coupled to the fiber and about 16.5% is coupled to the back monitor photodiode, thus the additional coupling loss due to beam shape distortion and lens attenuation is about 14.5%.

Although the present invention has been described with particular detail and illustrated with significant specificity, it should be understood that alternative embodiments of the present invention are also within its scope.

What is claimed is:

1. A system for monitoring the power output of a light source, comprising:

a light source for providing a light beam;

an optical lens positioned in the light beam, the optical lens having an input surface generally facing the light source and an output surface generally facing away from the light source, the optical lens further having first and second reflective surfaces; and a photo detector generally facing the input surface of the lens, wherein the first reflective surface of the lens is adapted to reflect a first portion of the light beam toward the photo detector and the second reflective surface of the lens is adapted to reflect a second portion of the light beam toward the photo detector.

2. The system of claim 1 further comprising:

a controller coupled to the photo detector and the light source, the controller receiving a signal from the photo detector that is indicative of the amount of light detected by the photo detector, the controller being adapted to provide a control signal to the light source that adjusts the power of the light source so that the signal from the photo detector is relatively constant.

3. The system of claim 1 wherein the first and second reflective surfaces are provided on the input surface of the lens.

4. The system of claim 3 wherein each of the first and second reflective surfaces is a concave surface on the input surface of the lens.

5. The system of claim 4 wherein the optical lens is an aspheric lens with the first and second concave reflective surfaces molded on the input surface of the lens.

6. The system of claim 3 wherein the light beam illuminates an illumination pattern on the input surface of the optical lens, wherein the illumination pattern has a central axis and an outer perimeter, the first and second reflective surfaces extending from at or near the center axis of the illumination pattern to at or near the outer perimeter of the illumination pattern.

7. The system of claim 1 wherein the first reflective surface is adapted to focus the first portion of the light beam onto the photo detector and the second reflective surface is adapted to focus the second portion of the light beam onto the photo detector.

8. The system of claim 1 wherein the first reflective surface has a rectangular shaped perimeter.

9. The system of claim 1 wherein the first reflective surface has a circular shaped perimeter.

10. The system of claim 1 wherein the first reflective surface has an oval shaped perimeter.

11. The system of claim 1 wherein the first reflective surface has an annular shaped perimeter surrounding an at least partially transmissive surface of the lens.

12. The system of claim 1 wherein each of the first and second reflective surfaces includes a coating of a reflective material.

13. The system of claim 12 wherein the coating includes a noble metal.

14. The system of claim 1 wherein the light source and photo detector are positioned adjacent to one another, and the optical lens is spaced from both the light source and photo detector.

15. The system of claim 14 further comprising an optical fiber, wherein the optical lens is adapted to couple at least part of the light beam from the light source into the optical fiber.

16. The system of claim 1 wherein the reflective surface reflects less than 25% of the power in the light beam that is provided by the light source.

17. The system of claim 1 wherein the light source includes a vertical cavity surface emitting laser (VCSEL).

18. The system of claim 1 wherein the light source includes a Light Emitting Diode (LED).

19. The system of claim 1 wherein the photo detector includes a photodiode.

20. The system of claim 1 wherein the light source has a numerical aperture that is dependent upon one or more operating conditions, the reflective surface being configured to reflect a relatively constant percent of the power of the light beam provided by the light source over a range of numerical apertures of the light beam.

21. A lens comprising:
   an input surface comprising:
      an input transmissive part for passing a portion of an incident light beam; and
      an input reflective part for reflecting a portion of the incident light beam to a first external device before passage of the light beam through the lens, the input reflective part being substantially non-transmissive; and
   an output surface comprising:
      an output transmissive part for passing a portion of a refracted light beam; and
      an output reflective part for reflecting a portion of the refracted light beam to a second external device after passage of the refracted light beam through the lens, the output reflective part being substantially non-transmissive.

22. The lens of claim 21 wherein the input reflective part covers less than half of the surface area of the input surface.

23. The lens of claim 22 wherein the input reflective part covers less than 25% of the surface area of the input surface.

24. The lens of claim 22 wherein the input reflective part reflects less than 25% of the power of the light that is incident on the input surface.

25. The lens of clam 21 wherein the input reflective part is integral with the lens.

26. The lens of claim 21 wherein the input reflective part is concave, and the input transmissive part is convex.

27. The lens of claim 21 wherein the input surface is an aspheric surface and the input reflective part is molded into the input surface.

28. The lens of claim 21 wherein one of the input and output reflective parts is coated with a reflective metal.

29. The lens of claim 28 wherein the reflective metal is a noble metal.

30. The lens of claim 21 wherein the input reflective part has a substantially annular shape.

31. The lens of claim 21 wherein the input reflective part has a substantially circular shape.

32. The lens of claim 21 wherein the input reflective part has a substantially oval shape.

33. The lens of claim 21 wherein the input reflective part has a substantially polygon shape.

34. A system for monitoring the power output of a light source, comprising:
   a light source that provides a light beam;
   a first photo detector;
   a second photo detector; and
   a lens positioned to receive the light beam, the lens including an input surface and an output surface, the input surface including a first reflective portion that reflects a first portion of the light beam away from the lens and toward the photo detector, wherein the first reflected portion of the light beam does not pass through the lens, the lens further including a second reflective portion configured to reflect a second portion of the light beam toward the second photo detector.

35. The system for monitoring as defined in claim 34, wherein the second reflective portion is included on the output surface of the lens.

36. The system of claim 1 wherein the first and second reflective surfaces are provided on the output surface of the lens.

37. The system of claim 15, wherein the optical fiber is butt coupled to the output surface of the optical lens.

* * * * *

UNITED STATES PATENT AND TRADEMARK OFFICE
CERTIFICATE OF CORRECTION

PATENT NO.       : 7,324,575 B2
APPLICATION NO.  : 10/781590
DATED            : January 29, 2008
INVENTOR(S)      : Chen et al.

It is certified that error appears in the above-identified patent and that said Letters Patent is hereby corrected as shown below:

Title Page
Item 56, References Cited, Foreign Patent Documents, change "10/1998" to --10/1989--

Drawings
Replace Figure 13 with the figure depicted below, wherein the axes have been labeled "Percent (%)" and "Temperature (C)"

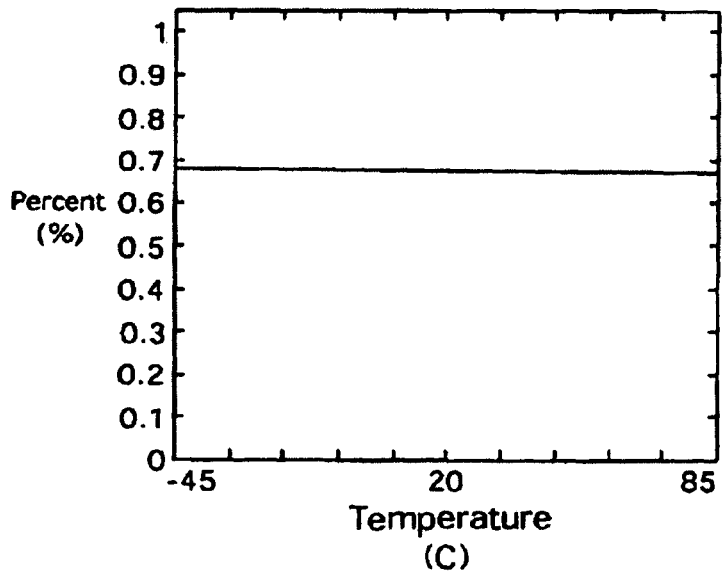

Rectangular mirror

Figure 13

Signed and Sealed this

Twenty-third Day of November, 2010

David J. Kappos
Director of the United States Patent and Trademark Office

Replace Figure 14 with the figure depicted below, wherein the axes have been labeled "Percent (%)" and "Temperature (C)"

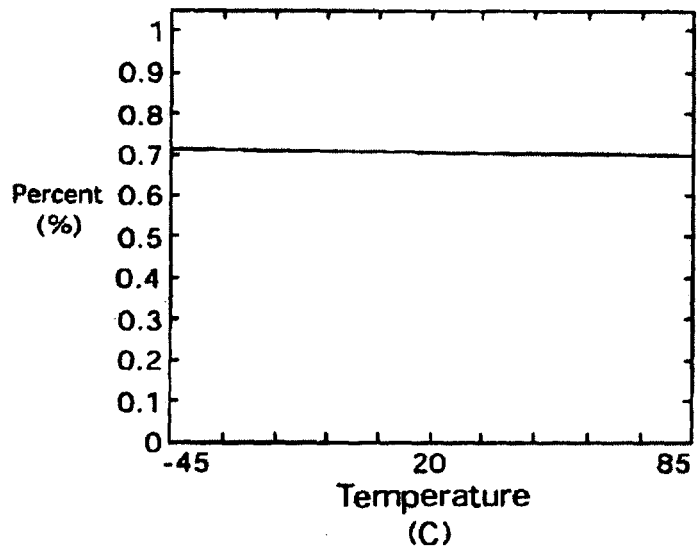

Annular mirror

Figure 14

Column 3
Line 67, change "lens" to --optical element--

Column 4
Line 31, change "flat" to --output--
Line 47, change "or (5) or any" to --or (6) any--

Column 5
Line 20, change "120''''''" to --120''''''--
Line 21, change "100''''''" to --100''''''--

Column 6
Line 28, change "or 325)" to --(or 325)--
Line 42, after "140", add [(FIGS. 5 and 6)]
Line 50, after "110", add [(FIG. 2)]
Line 51, after "140", add [(FIGS. 5 and 6)]
Line 62, after "130", add [(FIG. 1)]
Line 63, after "110", add [(FIG. 1)]

Column 7
Line 5, after "110", add [(FIG. 2)]
Line 7, after "140", add [(FIG. 2)]
Line 8, after "125", add [(FIG. 2)]
Line 9, after "140", add [(FIG. 2)]
Line 14, after "input surface", add [124]
Line 52, change "um, while other distances may be used." to --um. Other distances may also be used.--

Column 9
Line 16, change "the reflective surface" to --the first and second reflective surfaces--

Column 10
Line 1, change "clam" to --claim--